United States Patent
Shuman et al.

(10) Patent No.: US 6,322,672 B1
(45) Date of Patent: Nov. 27, 2001

(54) METHOD AND APPARATUS FOR MILLING COPPER INTERCONNECTS IN A CHARGED PARTICLE BEAM SYSTEM

(75) Inventors: Richard F. Shuman, Concord; Kathryn Noll, Tewksbury; J. David Casey, Jr., Boston, all of MA (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 09/522,561

(22) Filed: Mar. 10, 2000

(51) Int. Cl.[7] .................. C23C 14/34; C23F 1/00

(52) U.S. Cl. ................. 204/192.34; 204/142.35; 204/298.36; 216/66; 216/94

(58) Field of Search .............. 204/298.36, 192.34, 204/192.35; 216/66, 94

(56) References Cited

U.S. PATENT DOCUMENTS

| | | | |
|---|---|---|---|
| 3,699,334 | * 10/1972 | Cohen et al. | 204/192.34 |
| 4,874,460 | * 10/1989 | Nakagawa et al. | 204/192.34 |
| 5,228,501 | * 7/1993 | Tepman et al. | 118/728 |
| 5,958,799 | * 9/1999 | Russell et al. | 438/712 |

* cited by examiner

Primary Examiner—Rodney G. McDonald
(74) Attorney, Agent, or Firm—Michael O. Scheinberg

(57) ABSTRACT

A method of enhancing charged particle beam etching particularly suitable for copper interconnects, includes milling at non-contiguous locations to prevent the formation or propagation of an etch-resistant region within the rastered area. Two or more milling boxes are typically performed, one or more of the boxes having pixel spacing greater than the spot size, with the last box using a conventional pixel spacing (default mill) smaller than the spot size to produce a uniform, planar floor of the etched area.

22 Claims, 3 Drawing Sheets

FIG. 3A         FIG. 3B         FIG. 3C
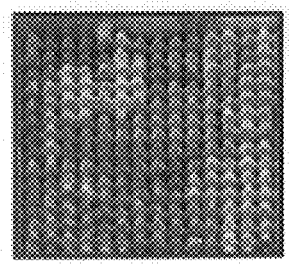 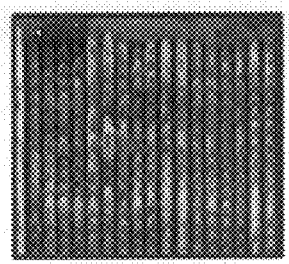 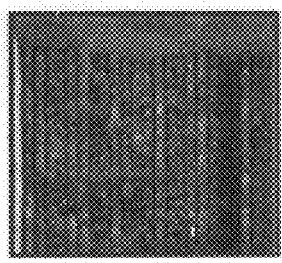
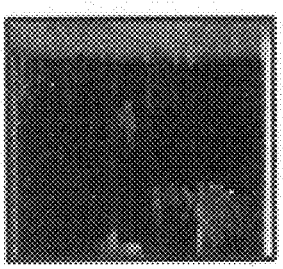 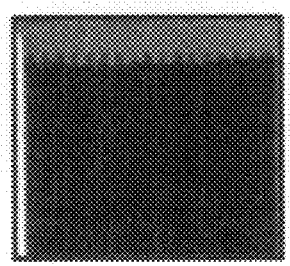 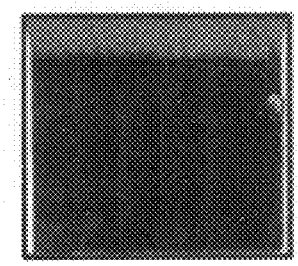
FIG. 3D         FIG. 3E         FIG. 3F
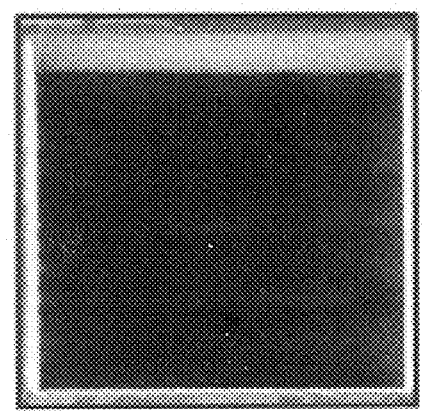 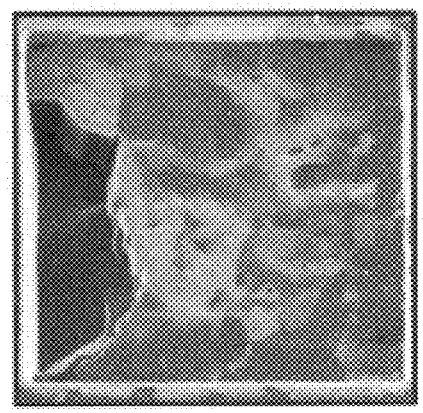
FIG. 4B                    FIG. 4A

METHOD AND APPARATUS FOR MILLING COPPER INTERCONNECTS IN A CHARGED PARTICLE BEAM SYSTEM

TECHNICAL FIELD OF THE INVENTION

The present invention relates to the field of charged particle beam processing and, in particular, to a method and apparatus for milling copper metallization of semiconductor circuits using a focused ion beam.

BACKGROUND AND SUMMARY OF THE INVENTION

Focused ion beam (FIB) systems are widely used in microscopic-scale manufacturing operations because of their ability to image, etch, mill, deposit, and analyze with great precision. Ion columns on FIB systems using gallium liquid metal ion sources (LMIS), for example, can provide five to seven nanometer lateral imaging resolution. Because of their versatility and precision, FIB systems have gained universal acceptance in the integrated circuit (IC) industry as necessary analytical tools for use in process development, failure analysis, and most recently, defect characterization.

The ion beam of a FIB system typically scans the surface of the integrated circuit in a raster pattern. This raster pattern is often used first to produce an image of the surface showing the top lines and elements of the circuit. The image is used together with circuit layout information to navigate the ion beam around the integrated circuit to locate a specific element or a feature of the circuit. Upon moving the raster pattern to the local area of the feature of interest, the ion beam current is increased to cut into the die and expose circuit features in buried layers. The FIB system can then alter the exposed circuit by cutting conductive traces to break electrical connections or depositing conductive material to provide new electrical connections. A gaseous material is often directed to the sample at the impact point of the ion beam, and the ions induce a chemical reaction that selectively increases the etch rate or deposits material, depending on the gaseous compound that is used.

Until recently, milling applications for FIB systems on metal interconnects of integrated circuits have been limited to the sputtering of polycrystalline aluminum or tungsten. Both materials can be milled by rastering a beam of gallium ions across the area of interest. To increase the etch rate, a gas containing a member of the halogen group (bromine, chlorine, or iodine) is often directed to the impact point of the ion beam to enhance etching. The beam is typically scanned across the area to be milled using digital electronics that step the beam from point to point. The distance between points is referred to as the pixel spacing. When milling without gas, the pixel spacing is typically less than the beam spot size, that is, each subsequent beam position overlaps the previous position to ensure a uniform cut and a smooth finish. This method is referred to as 'Default Milling'. Milling methods have been well documented, for example, in U.S. Pat. No. 5,188,705 to Swanson, et. al. for "Method of Semiconductor Device Manufacture".

In recent years, semiconductor manufacturers have begun a migration toward the use of copper as a replacement for aluminum interconnects. As manufacturers strive to increase the speed at which chips work, the use of copper interconnects provides several advantages over aluminum. For example, copper has lower sheet resistance and exhibits both improved metal line and line/via/line electromigration reliability.

The halogens that are used to enhance focused ion beam etching of other metal interconnect materials do not significantly enhance the etching of copper, and no other chemical suitable for routine FIB milling of copper has been found. For example, the etch byproducts formed during the use of halogen compounds on copper at room temperature have low volatility and tend to leave detrimental deposits on the sample surface and via side walls. Thus, the milling of copper conductors is slow because there are no suitable etch-enhancing chemicals. Moreover, the milling of copper without chemicals has been found to produce non-uniform material removal, even when the ion beam is applied uniformly. The non-uniform removal causes the floor of the etched area to become non-planar, which in-turn can cause unacceptable milling of the material under the copper conductor; i.e., as milling continues to remove the remaining copper from one region under the ion beam, significant damage is incurred by milling the exposed underlayer in areas where the copper has already been removed.

This non-uniform milling is thought to be attributable to the formation of a resistant Cu region that forms during milling and propagates across the area exposed to the ion beam. This region appears to channel incoming ions into the crystal, thereby reducing the sputtering rate of copper by the incoming ions. The region appears black when imaged using the ion beam in secondary electron mode, apparently because the increased channeling of the incoming ions also reduces the ejection of secondary electrons near the surface.

The region is thought to be composed of a Cu—Ga alloy. Once formed, this area inhibits the surface-sputtering rate by a factor of between about 2 to about 4. Because this area forms over time during the milling procedure and because of channeling variations, the rastered region etches non-uniformly. Scanned areas less than one micron wide do not always exhibit the formation of black regions and appear to etch uniformly in many cases. In addition, the use of either $Br_2$ or $Cl_2$ gas during milling does not appear to mitigate the formation of the resistant area, and the search for additional room temperature enhancement gases has been, so far, unsuccessful.

An object of the invention, therefore, is to improve the uniformity of charged particle beam milling of copper and other materials.

Another object of the invention is to improve the rate of charged particle beam milling of copper and other materials.

Yet another object of the invention is to improve the rate and uniformity of focused ion beam milling of copper and other materials without the use of a toxic or corrosive gas.

Applicants have discovered that the etch rate of copper conductors is increased over default milling and the sample is etched more uniformly if the ion beam moves initially, not in a raster pattern of overlapping pixels, but in a pattern in which the sample is typically milled at a series of non-contiguous points. As the milling continues, the milling points move progressively closer together until, to complete the milling, a raster pattern of overlapping points is typically milled. For example, a first dose of ions may be applied at milling locations or pixels spaced 0.5 $\mu$m apart in the x and y directions. Subsequent doses can be applied at pixel spacings of 0.4 $\mu$m, 0.3 $\mu$m, 0.25 $\mu$m, and 0.1 $\mu$m. A final milling at a 0.05 $\mu$m pixel spacing producing a uniform finish to the floor of the milled area. In this example, six milling steps are described. Successful milling of copper has been achieved with as few as two and as many as ten milling steps, depending on specific copper characteristics such as thickness and grain structures. Because the milling within a rastered area is more uniform, the invention reduces damage to the material lying under the copper conductor. This damage is caused by continuous milling of an area from which copper has been removed while attempting to remove the remaining copper from an adjacent resistant area within the rastered box.

The inventive milling method inhibits the formation of the etch-resistant area, perhaps by reducing localized heating of the copper conductor. Milling non-contiguous locations may allow energy imparted by the impact of the ion beam at one location to dissipate through the specimen before the beam returns to that area, thereby preventing the accumulation of energy necessary to cause formation of the etch resistant region. Other methods of allowing energy from the beam to dissipate before the etch resistant area forms may also be effective in preventing the formation of the etch resistant regions and are within the scope of applicants' discovery and invention. For example, the accelerating voltage of the focused ion beam could be reduced from the typical range of 30 keV to 50 keV to a reduced range, such as between 1 keV and 20 keV, thereby imparting less into the target per ion. The propagation of the etch resistant area may also be reduced because the inventive method creates holes that isolate the copper into segments, and the etch resistant areas may be unable to propagate across these holes.

The inventive milling method not only prevents formation of the etch resistant area, it also increases the milling rate of the copper conductor in general. Because of the finite edge resolution of the ion beams, the sides of the milled holes are not exactly perpendicular to the surface. This increases the exposed surface area of the target and causes some of the impacting ions to strike part of the target surface at a non-normal angle. Both the increased surface area and the non-normal angle of incidence are thought to increase the etch rate.

Because the invention does not depend on a chemical precursor to increase the etch rate and contribute to etch uniformity, it is not limited to any particular type of sample material, although the benefit of the invention are particularly apparent in milling copper, which tends to form etch-resistant regions. By not requiring the use of etch-enhancing gases, which are typically corrosive or toxic, problems associated with the handling of such gases are avoided.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A–3F show samples after a series of milling operations in accordance with the method of FIG. 2. FIG. 3A shows the results of applying a first milling box to the sample. FIG. 3B shows the application of a second milling box to the sample from FIG. 3A, FIG. 3C shows the application of a third milling box to the sample from FIG. 3B, and so forth.

FIG. 4A shows the results of a conventional raster milling, and FIG. 4B shows the results of milling in accordance with the invention using a dose of 5.5 nC/$\mu m^2$ in each box.

DETAILED DESCRIPTION OF PREFERRED EMBODIMENTS

Figure 1:
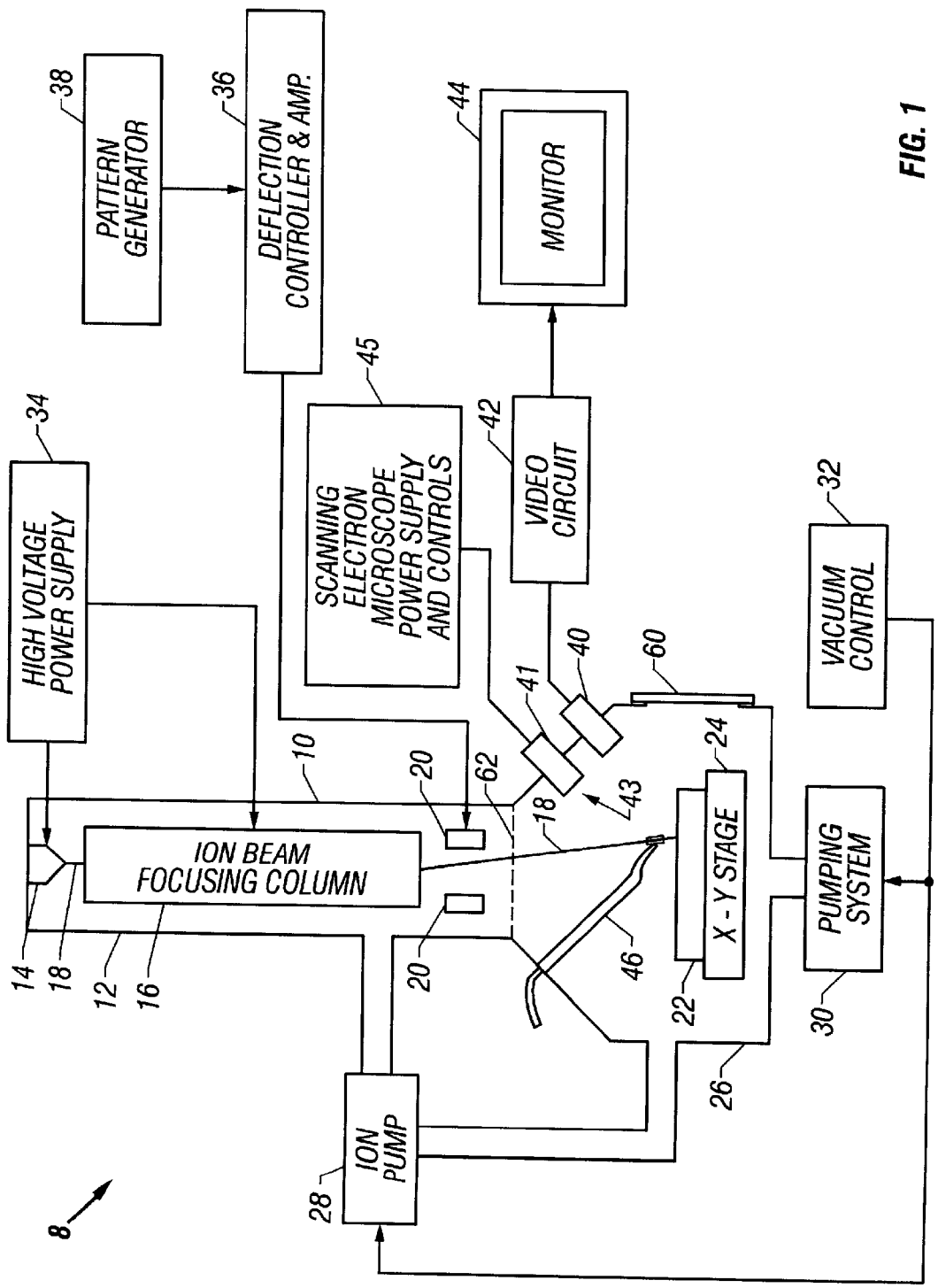
FIG. 1 shows a schematically typical focused ion beam system used in a preferred embodiment of the invention.

In FIG. 1, a focused ion beam system 8 includes an evacuated envelope 10 having an upper neck portion 12 within which are located a liquid metal ion source 14 and a focusing column 16 including extractor electrodes and an electrostatic optical system. Ion beam 18 passes from source 14 through column 16 and between electrostatic deflection means schematically indicated at 20 toward sample 22, which comprises, for example, a semiconductor device positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32. The vacuum system provides within chamber 26 a vacuum of between approximately $1\times10^{-7}$ Torr and $5\times10^{-4}$ Torr. If an etch-assisting or an etch retarding gas is used, the chamber background pressure is typically about $1\times10^{-5 \, Torr.}$ High voltage power supply 34 is connected to liquid metal ion source 14 as well as to appropriate electrodes in focusing column 16 for forming an approximately 1 keV to 60 keV ion beam 18 and directing the same downwardly. Deflection controller and amplifier 36, operated in accordance with a prescribed pattern provided by pattern generator 38, is coupled to deflection plates 20 whereby beam 18 may be controlled to trace out a corresponding pattern on the upper surface of sample 22. The pattern to be traced is described in detail below. In some systems the deflection plates are placed before the final lens, as is well known in the art.

The source 14 typically provides a metal ion beam of gallium, although other ion sources, such as a multicusp or other plasma ion source, can be used. The source typically is capable of being focused into a sub one-tenth micron wide beam at sample 22 for either modifying the surface 22 by ion milling, enhanced etch, material deposition, or for the purpose of imaging the surface 22. An charged particle multiplier 40 used for detecting secondary ion or electron emission for imaging is connected to video circuit and amplifier 42, the latter supplying drive for video monitor 44 also receiving deflection signals from controller 36. The location of charged particle multiplier 40 within chamber 26 can vary in different embodiments. For example, a preferred charged particle multiplier 40 can be coaxial with the ion beam and include a hole for allowing the ion beam to pass. A scanning electron microscope 41, along with its power supply and controls 45, are optionally provided with the FIB system 8.

A fluid delivery system 46 optionally extends into lower chamber 26 for introducing and directing a gaseous vapor toward sample 22. U.S. Pat. No. 5,851,413 to Casella et al. for "Gas Delivery Systems For Particle Beam Processing," assigned to the assignee of the present invention, describes a suitable fluid delivery system 46.

A door 60 is opened for inserting sample 22 on stage 24 which may be heated or cooled, and also for servicing the reservoir 50. The door is interlocked so that it cannot be opened if the system is under vacuum. The high voltage power supply provides an appropriate acceleration voltage to electrodes in ion beam column 16 for energizing and focusing ion beam 18. When it strikes the sample, material is sputtered, that is physically ejected, from the sample. Focused ion beam systems are commercially available, for example, from FEI Company, Hillsboro, Oreg., the assignee of the present application.

Figure 2:
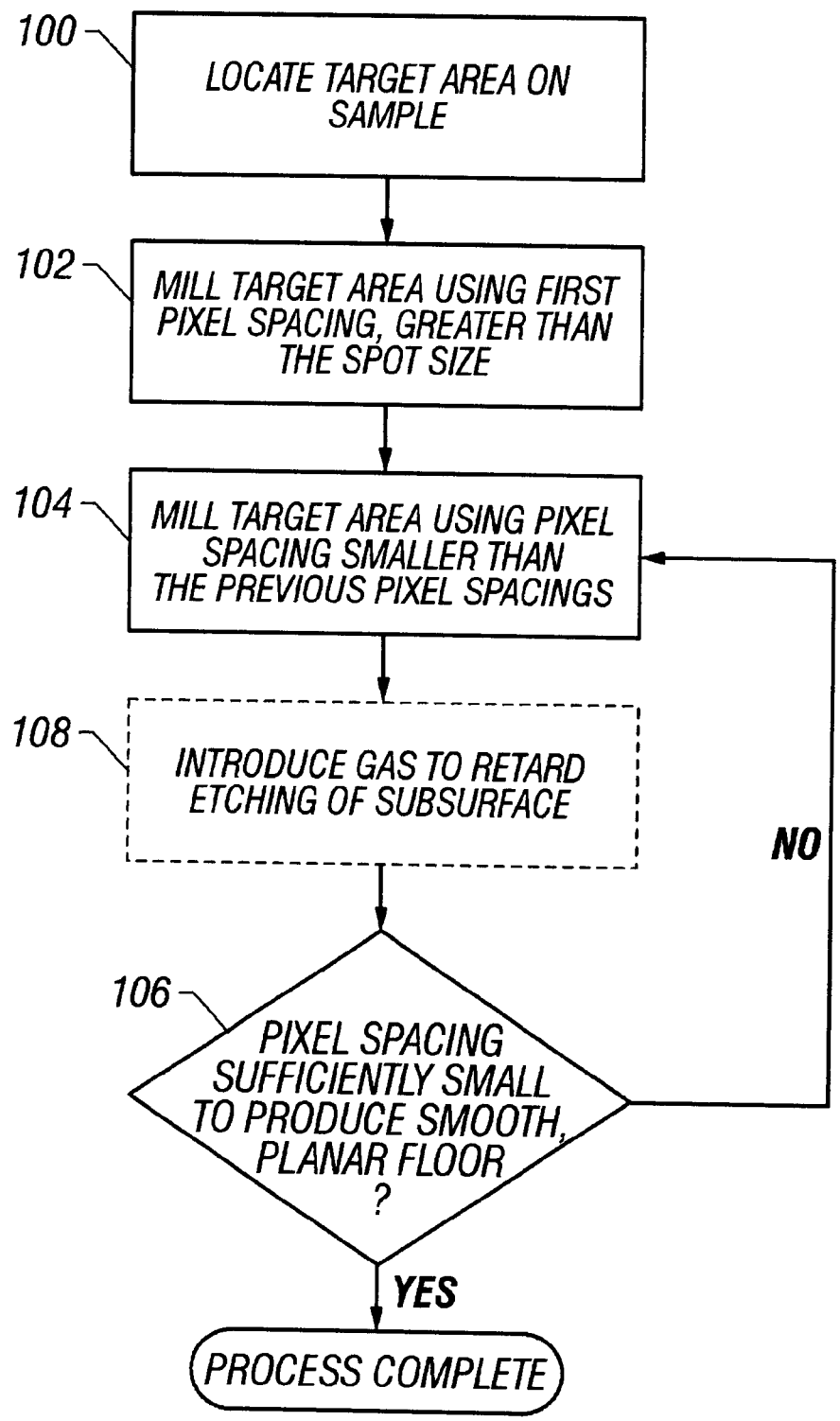
FIG. 2 is a flow chart showing a preferred method of operating the FIB system of FIG. 1.

In a preferred embodiment of the present invention, signals applied to deflection controller and amplifier 36 cause the focused ion beam to move within a target area to be milled in a novel pattern that increases the milling rate and produces more uniform material removal. FIG. 2 is a flowchart showing the steps involved in a preferred embodiment of the present invention. In step 100, a target area to be milled is located on sample 22 in lower chamber 26. In step 102, the target area is milled using a pixel spacing greater than the beam spot size, defined as the diameter from edge to edge of the ion beam at the target surface, the edge of the beam being considered the point where the beam intensity drops to one tenth of its maximum value. The ion beam typically has a spot size for milling of between 0.05 µm and 0.15 µm, although, depending upon the target to be milled, beams as small as 0.005 µm are readily attainable and can be used, as can beams as large 0.8 µm or larger.

In step 104, the target area is milled again, using a pixel spacing smaller than that used step 102. Depending upon the material being milled, the size of the area being milled, the characteristics of the ion beam being used, step 104 is repeated, with the pixel spacing being reduced, until, as shown in step 106, the pixel spacing is sufficiently small to produce a smooth, planar floor on the target area. Optionally, a gas is applied in step 108 to the decrease the etch rate of the underlying material to further reduce any unintentional etching of the underlying substrate. For example, a jet of water vapor, oxygen, or other oxygen containing vapor can be directed toward the impact point of the ion beam to inhibit etching of a dielectric material under a copper conductor. Depending upon the material being etched, a gas can also be applied during the entire etch process to either increase the etch rate of the milled thin-film metal or inhibit the etch rate of the lower level dielectric under the film.

In a preferred embodiment, referred to as Variable Pixel Milling (VPM), the invention uses a series of "milling boxes." A milling box is defined as a group of milling locations or pixels spaced apart by specified amounts in the x and y directions. An average ion dose, expressed as charge per unit area, is specified for each milling box. The ion beam moves between milling locations in the box, milling at the milling locations until each milling location in the box has received approximately the designated average dosage specified for the box. At each milling location, a hole having a diameter roughly equivalent to the beam spot size is milled. In applying the dose, the ion beam typically visits each point in the box multiple times, rather than delivering to each point the entire dose for the box during a single dwell period. After the first milling box is completed, the sample surface will have multiple holes separated by unmilled material.

Multiple milling boxes are applied, each having successively closer pixels. The 'nested' boxes are positioned over the desired feature of interest and the milling is performed serially, with subsequent boxes having closer pixel spacing. The result is a series of segregated copper islands that suppress the formation of the highly channeling black region. By suppressing the formation of this region, the milling produces a flat, uniform surface. In addition, the increased surface area achieved by the formation of these copper islands enhances overall milling efficiency by a factor of about 1.25 to about 4.0.

Some of the holes milled in subsequent boxes will typically overlap previously milled holes. Upon finishing the complete set of milling boxes, however, the amount of material removed from each point in the sample is approximately equal to produce a uniform, planar floor over the entire area milled. The last milling box typically uses conventional pixel spacing, that is, the pixel spacing is smaller than the beam spot size to produce a smooth, uniformly milled area.

In one preferred embodiment for milling a copper interconnect using a 150 µm aperture in the FIB column and a beam current of 2.04 nA, six milling boxes are used. The ion beam has a beam spot size of between 0.05 µm and 0.10 µm. The parameters of each box are shown below in Table 1 for a copper thickness of 1.0 µm.

TABLE 1

| Box Number | Pixel space X (µm) | Pixel space Y (µm) | Average Dose (nC/(µm$^2$) |
|---|---|---|---|
| 1 | 0.50 | 0.50 | 0.5 |
| 2 | 0.40 | 0.40 | 0.4 |
| 3 | 0.30 | 0.30 | 0.4 |
| 4 | 0.25 | 0.25 | 0.4 |
| 5 | 0.10 | 0.10 | 0.25 |
| 6 | 0.05 | 0.05 | 0.25 |

The first five of the milling boxes of Table 1 use a pixel spacing that is significantly larger than those used for standard default milling. Only the last milling box uses the conventional default scan spacing. Within each milling box, the beam makes multiple circuits, that is, each pixel is milled multiple times, until it has received approximately the average dose designated for the box. The beam typically dwells at each pixel for approximately 5 µsec, resulting in a dose at each pixel of about 0.001 nC during each dwell period.

FIGS. 3A–3F shows the sample after each of the milling boxes is sequentially applied, with FIG. 3F showing a sample after the last milling box is complete. FIG. 3F shows the sample having a smooth bottom surface with no residual copper evident. FIG. 4A shows a sample copper interconnect milled using convention milling, and FIG. 4B shows for comparison a similar copper interconnect milled in accordance with the present invention.

Mill boxes have been successfully scaled over a wide range of sizes which extend from greater than 20 µm×20 µm to 1 µm×1 µm using a 150 µm aperture. The boxes are simply expanded or contracted to the desired area, maintaining the same pixel spacing and dosages.

Use of apertures that are either larger or smaller than 150 µm requires careful scaling of the pixel spacing for the successful execution of this procedure. Applicants have scaled milling boxes over an aperture range of 50 µm to 150 µm. For example, to maintain the milling time to as short a period as possible for areas larger than 20 µm×20 µm, a FIB operator can choose a larger aperture which provides both an increase in spot size and greater beam current. As the spot size increases, the pixel spacing in the multiple boxes must be correspondingly increased, so that the pixels are not contiguous in the first few boxes. Skilled persons will be able to determine without undue experimentation a set of boxes to use for any aperture size guided by the example provided above.

Applicants have also found that the milling specifications, that is, the pixel spacing, dose, ion energy, beam size, and other parameters, of each box, as well as the number of different boxes used, may be varied to optimize milling depending on the copper characteristics including the copper grain structure and thickness. Applicants have successfully milled copper using as few as two and as many as ten milling boxes. The specification of each milling box and the number of boxes can be determined experimentally using the example and information provided above as a guide.

It is also possible to use a gas to assist in the production of a uniform floor. Water vapor has been shown to inhibit the etching silicon oxides, as described in U.S. Pat. No. 5,958, 799 to Russell, et. al. for "Method for Water Vapor Enhanced Charged-Particle-Beam Machining." When water vapor is applied during copper milling, it will inhibit milling of the oxide underlying the copper conductor.

Although in the patterns described above, the milling is being performed in rectangular arrays of fixed pixel spacings within each box, the invention is not limited to that embodiment. For example, the pixel spacing can be gradually reduced, rather than being reduced in discrete steps, and the milling locations do not need to be distributed in a rectangular or regular pattern, so long as the pixels are spaced widely enough to prevent the growth of etch-resistant areas and the amount of material eventually removed from each point is about the same to produce a flat, smooth, planar floor. The pixel spacing could even remain unchanged, with the pixel locations changing in subsequent scans to produce a flat, smooth, planar floor.

The inventive milling method appears to inhibit the formation of the etch-resistant area, perhaps by reducing localized heating of the copper conductor. Milling non-contiguous locations may allow energy imparted by the impact of the ion beam at one location to dissipate before the beam returns to that area, thereby preventing the accumulation of energy necessary to cause formation of the etch resistant region. Other methods of allowing energy from the beam to dissipate before the etch resistant area forms may also be effective in preventing the formation of the etch resistant regions and are within the scope of applicants' discovery and invention.

For example, applicants have found that a reduced beam energy can also prevent the formation of the etch resistant region. A preferred reduced beam energy provides sufficient energy to sputter the copper at an acceptable rate, yet provides insufficient excess energy to form etch-resistant regions. For example, the accelerating voltage of the focused ion beam could be reduced from the typical milling range of 30 keV to 50 keV to impart less into the target per ion. A preferred beam energy is less than about 20 keV and more preferably less than about 10 keV. A preferred minimum energy is about 1 keV. Applicants have found an energy of about 5 keV to be suitable for some copper targets.

Although applicants have described herein a theory to account for the success of the invention, the invention has been shown to work empirically, independently of the underlying mechanism.

The preferred embodiment uses a focused ion beam, although the method of the present invention may also be useful for electron beam processing. The invention has been shown to solve the problem of milling copper interconnects, but can be applied to any charged particle milling including plasma gas ion sources and is not limited to any specific material or application.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of focused ion beam milling of copper on a specimen, comprising
    directing the focused ion beam toward the copper in a first pattern, characterized by a first pixel spacing greater than a spot size characterizing the focused ion beam;
    directing the focused ion beam toward the copper in a second pattern characterized by a second pixel spacing, the second pixel spacing being less than the first pixel spacing and less than or approximately equal to the ion beam spot size, thereby producing a uniformly smooth floor of the milled area with substantially no remaining copper.

2. The method of claim 1 further comprising directing a jet of water vapor, oxygen, or other oxygen containing vapor toward the impact point of the ion beam to inhibit etching of a material under the copper conductor.

3. The method of claim 1 in which directing the focused ion beam toward the copper in a first pattern and directing the focused ion beam toward the copper conductor in a second pattern includes directing a sub-micron beam of gallium ions.

4. A method of charged particle beam milling of a target area on a specimen surface, the charged particle beam being characterized by a spot size, the method comprising:
    milling with the charged particle beam at multiple first milling locations within the target area, the first milling locations being spaced apart from each other by a distance greater than the spot size to produce a series of holes in the target area; and
    milling at multiple second milling locations, the second milling locations being spaced apart from each other by less than the spacing of the first milling locations and removing remaining material from the target area to produce a smooth floor.

5. The method of claim 4 in which milling with the charged particle beam at multiple first locations includes performing a series of milling steps, each step comprising milling at multiple milling locations separated by a pixel distance associate with the step, the pixel distances on a subsequent step being less than the pixel distance in a previous step.

6. The method of claim 5 in which the pixel spacing of each step is less than the pixel spacing of the previous step and in which the second milling locations are separated by distances approximately equal to or less than less than the spot size.

7. The method of claim 4 in which the second milling locations are separated from other ones of the second milling locations by a distance or distances approximately equal to or less than less than the spot size.

8. The method of claim 4 in which the first milling locations form one or more rectangular grid.

9. The method of claim 4 further comprising directing a gas toward the milling locations to inhibit etching of material below the target area.

10. The method of claim 9 in which the gas comprises water vapor, oxygen, or other oxygen containing material.

11. The method of claim 4 in which the charged particle beam is a focused ion beam.

12. The method of claim 11 in which the area to be milled comprises a copper conductor.

13. The method of claim 12 in which the focused ion beam comprises a beam of gallium ions from a liquid metal ion source.

14. The method of claim 4 in which milling with the charged particle beam at multiple first locations includes milling at multiple milling locations by scanning an ion beam through a series of pixels, the scanning being characterized by a pixel spacing, the pixel spacing being greater than the spot size.

15. The method of claim 14 in which milling at multiple second locations includes milling at second milling locations that are less than or equal to the spot size.

16. A method of inhibiting the formation or propagation of etch-resistant regions on the surface of a specimen during focused ion beam milling of a target area including copper, the method comprising:

directing a focused ion beam to the target area to etch at multiple first locations spaced sufficiently apart to prevent the formation or propagation of the etch-inhibiting region in the copper; and directing the focused ion beam to etch at multiple overlapping locations to produce a uniform, planar milled target area, the multiple overlapping locations being spaced apart less than the multiple first locations are spaced apart.

17. The method of claim 16 in which the target area comprises copper and in which ion beam is characterized by a spot size and in which directing the focused ion beam to etch at multiple locations sufficiently separated to prevent formation or propagation of the etch-inhibiting region includes directing the focused ion beam to etch at multiple locations separated by distances greater than the spot size.

18. The method of claim 16 in which directing the focused ion beam to etch at multiple overlapping locations includes scanning the ion beam at a rate sufficient to prevent the formation or propagation of etch-resistant regions.

19. An apparatus for focused ion beam milling of a target area including copper, the apparatus comprising:

an ion source;

an ion column including deflection electrodes for directing the ion beam, the deflection electrodes programmed for first directing the focused ion beam to etch the copper at multiple first locations spaced sufficiently separated to prevent formation or propagation of the etch-resistant regions in the copper and then for directing the focused ion beam to etch at multiple overlapping locations spaced apart less than the first locations are spaced apart to produce a uniform, planar milled target area.

20. The apparatus of claim 19 in which the ion beam is characterized by a spot size and in which the multiple locations spaced sufficiently separated to prevent formation or propagation of the etch-inhibiting region are separated by a distance greater than the spot size.

21. The apparatus of claim 19 in which the deflection electrodes are programmed to direct the focused ion beam to etch at multiple overlapping locations includes scanning the ion beam at a rate sufficient to prevent the formation or propagation of the etch-resistant region in the copper.

22. The apparatus of claim 19 further comprising a supply of a gas and a nozzle for directing the gas at the target area.

* * * * *